United States Patent [19]

Rabinovich

[11] Patent Number: 5,758,816
[45] Date of Patent: Jun. 2, 1998

[54] METHOD FOR ATTACHING SMALL COMPONENTS TO EACH OTHER

[75] Inventor: Simon M. Rabinovich, Plano, Tex.

[73] Assignee: Honeywell Inc., Minneapolis, Minn.

[21] Appl. No.: 700,069

[22] Filed: Aug. 19, 1996

[51] Int. Cl.$^6$ .................. B23K 1/00; B23K 31/02; B23K 103/18
[52] U.S. Cl. .................. 228/121; 228/227; 228/233.2
[58] Field of Search .................. 228/121, 233.2, 228/227

[56] References Cited

U.S. PATENT DOCUMENTS

| | | | |
|---|---|---|---|
| 3,340,602 | 9/1967 | Hontz | 228/233.2 |
| 4,356,047 | 10/1982 | Gordon et al. | 228/121 |
| 4,746,583 | 5/1988 | Falanga | 228/121 |
| 4,833,102 | 5/1989 | Byrne et al. | 228/121 |
| 4,972,988 | 11/1990 | Ohdate | 228/233.2 |

Primary Examiner—P. Austin Bradley
Assistant Examiner—Jeffrey T. Knapp
Attorney, Agent, or Firm—William D. Lanyi; Roland W. Norris

[57] ABSTRACT

A method is provided to heat a plurality of components to a preselected temperature that creates a tackiness at the surface of a preformed solder component and permits the preformed solder component to adhere to a first metallic surface of a first component. When the preselected temperature is reached, the components are rapidly cooled to prevent diffusion that would result from further heating and melting of the preformed solder component. In a particularly preferred embodiment of the invention, the first component is a lens that has a first metallic surface rigidly attached thereto. A second metallic surface is attached to a ceramic body and a preformed solder component is disposed between the first and second metallic surfaces. After a first assembly is formed from the first metallic surface and the preformed solder component that adheres to it, the first assembly is disposed on the second surface and the preformed solder component is completely melted to rigidly attach the first and second metallic surfaces to each other to provide a hermetic seal.

20 Claims, 11 Drawing Sheets

METHOD FOR ATTACHING SMALL COMPONENTS TO EACH OTHER

BACKGROUND OF THE INVENTION

1. Field of the Invention

The present invention relates generally to a method for attaching small components together using a preformed solder component.

2. Description of the Prior Art

Because of the miniaturization of many semiconductor components, such as light emitting diodes, it is necessary to accurately position very small components with respect to each other and attach the components to each other to form hermetically sealed devices. In certain situations, the individual components are so small that placing them accurately in position becomes an increasingly difficult task. One particular assembly, used to provide a light emitting diode device, requires the placement of a lens on a metallization layer of a ceramic substrate with a preformed solder component disposed therebetween. With the preformed solder component accurately positioned between a first metallic surface of a first component and a second metallic surface of a second component, the assembly is then heated to completely melt the preformed solder component and permanently attach the first component to the second component in a way that provides a hermetically sealed device. This requirement presents a severe challenge because of the very small size of the individual components. Therefore, it would be significantly beneficial if a method could be provided to simplify the placement of the components in their proper positions prior to the final melting of the preformed solder component.

SUMMARY OF THE INVENTION

In a preferred embodiment of the present invention, a method for attaching small components to each other comprises the steps of providing a first component having a first metallic surface, providing a second component having a second metallic surface and providing a preformed solder component. The preformed solder component is disposed in contact with the first metallic surface of the first component. The first metallic surface and the preformed solder component are then heated to a preselected temperature which is greater than that required to cause the preformed solder component to adhere to the first metallic surface to form a first assembly, but less than that required to completely melt the preformed solder component. When the first metallic surface and the preformed solder component reach the preselected temperature, they are then rapidly cooled by causing a stream of cold gas to flow in thermal communication with a heating element used to raise the temperature of the first assembly to the preselected temperature. These steps cause the preformed solder component to adhere to the first metallic surface of the first component. This adherence creates a first assembly that comprises the first component and the preformed solder component. After this assembly is formed in the manner described above, it is disposed on the second component with the preformed solder component disposed in contact with the second metallic surface. Finally, the temperature of the preformed solder component is raised to completely melt the preformed solder component, whereby the first and second metallic surfaces are rigidly attached to each other. This attachment also attaches the first component to the second component to form a hermetic seal therebetween.

BRIEF DESCRIPTION OF THE DRAWINGS

The present invention will be more fully and completely understood from a reading of the Description of the Preferred Embodiment in conjunction with the drawings, in which.

DESCRIPTION OF THE PREFERRED EMBODIMENT

Figure 1:
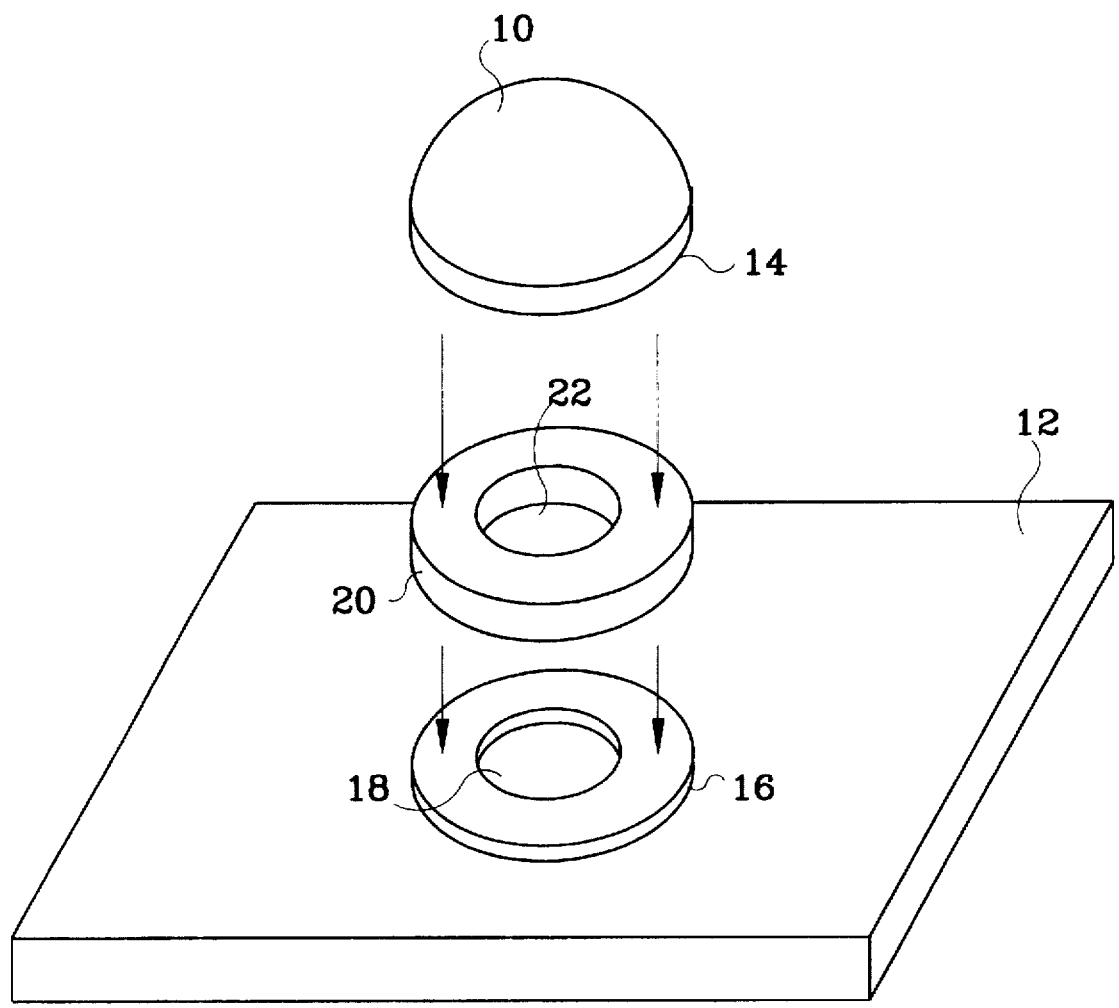
FIG. 1 illustrates the problem solved by the present invention.

Throughout the Description of the Preferred Embodiment, like components will be identified by like reference numerals. FIG. 1 is a schematic representation of one particular application to which the present invention is particularly beneficial. In the exploded view of FIG. 1, a lens 10 must be attached to a ceramic body 12 in such a way that a hermetic seal is formed therebetween. The lens 10, or first component, is provided with a gold plated Kovar ring 14 that is rigidly attached thereto. Kovar is an alloy comprising cobalt, nickel and iron. The ceramic body 12, or second component, is provided with a gold metallization layer 16 which surrounds the region 18 over which the lens 10 is to be placed. A preformed solder component 20 is disposed between the gold plated Kovar ring 14, or first metallic surface, and the gold metallization layer 16, or second metallic surface. The preformed solder component 20 is annular in shape and has an opening 22 formed therethrough. In the terminology used to describe the preferred embodiment of the present invention, the lens 10 is the first component, the gold plated Kovar ring 14 is the first metallic surface, the ceramic body 12 is the second component, the gold metallization layer 16 is the second metallic surface, and the preformed solder component 20 is disposed therebetween.

In order to understand the significant problems inherent in creating an assembly such as that schematically represented in FIG. 1, it should be realized that standard manufacturing techniques known to those skilled in the art will not permit a satisfactory assembly of these components. For example, if the preformed solder component 20 is placed in contact with the first metallic layer, or gold plated Kovar ring 14, and completely melted to adhere it to the first metallic surface, portions of the gold plated Kovar ring with its constituent ingredients of cobolt (17%), nickel (29%) and iron (54%) will diffuse into the solder and destroy its precise eutectic formulation. Then, if the melted preformed solder component 20 is later remelted to attach the lens 10 to the second metallic surface 16, it will not exhibit the desirable wettability necessary to create a hermetic seal between the first metallic surface and the second metallic surface. The degradation in solderability results from the combination of the cobolt, nickel and iron, from the Kovar, into the solder during its initial melting. When used in conjunction with gold plated surfaces, the preformed solder component 20 can only be satisfactorily melted a single time. If a second melt is attempted, the previous diffusion of gold, cobolt, nickel and iron into the solder will change its composition and the preformed solder component 20 will no longer be eutectic at the desired temperature and will not be as wettable when placed in contact with the other gold plated metallic surface 16. The primary function of the present invention is to avoid the undesirable results described above and to permit the very small components to be accurately positioned with respect to each other and attached together to form the hermetic seal.

Figure 2:
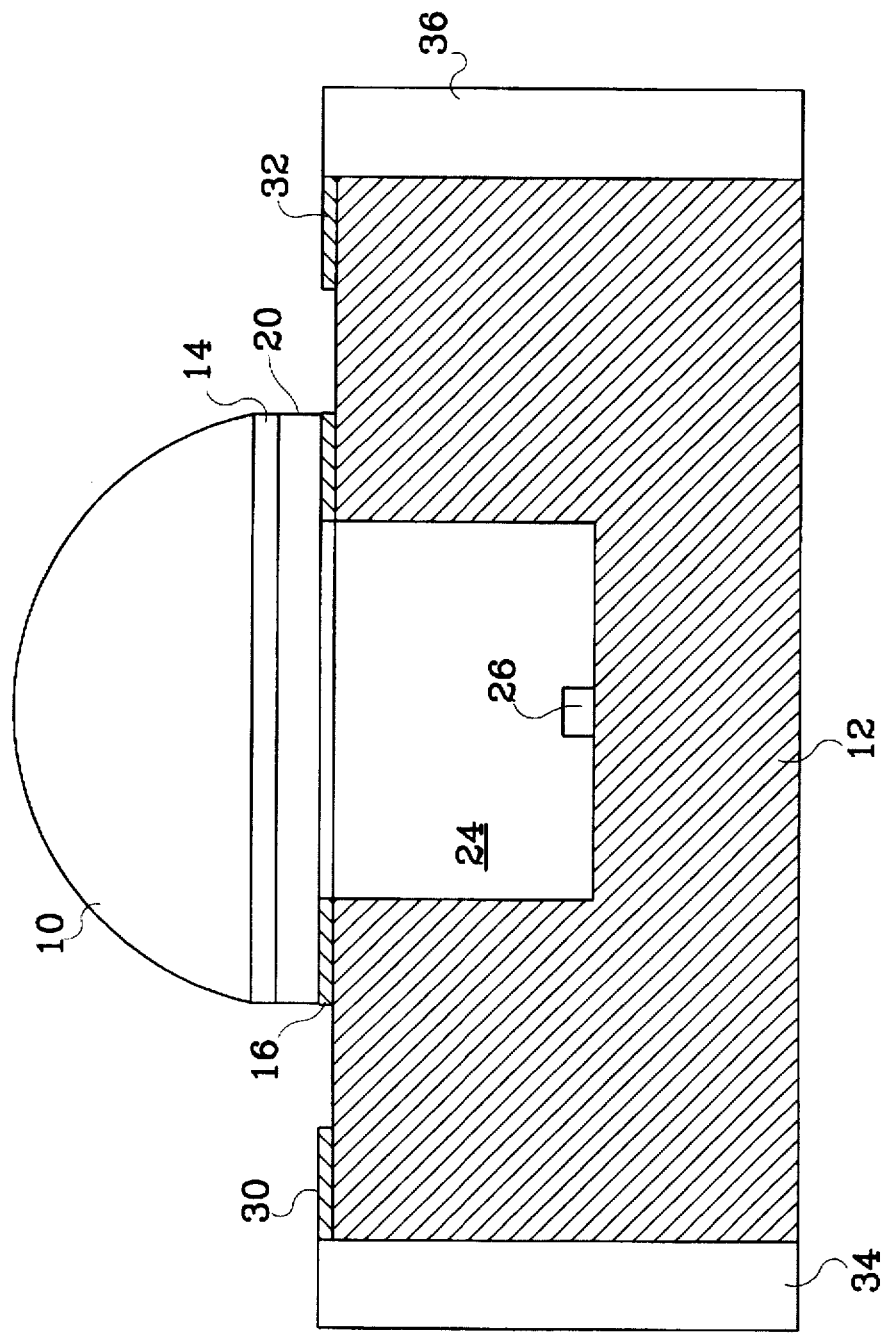
FIG. 2 is a sectioned view of a component manufactured by the method of the present invention.

FIG. 2 shows a sectional view of the assembled device after the lens 10 is hermetically attached to the ceramic body 12. In FIG. 2, the preformed solder component 20 has been melted, resolidified and rigidly attached to the first metallic surface 14 and also to the second metallic surface 16. The lens 10 is disposed over an opening 24 formed in the ceramic body 12 and a semiconductive device 26 is disposed in the opening 24. The semiconductive device 26 can be a light emitting diode, but is should be clearly understood that the method of the present invention can be used to manufacture many other different components. FIG. 2 illustrates one particular device that is manufacturable by using the method of the present invention. On the upper surface of the second component 12, or ceramic body, two other metallization layers are provided. One is identified by reference numeral 30 and the other is identified by reference numeral 32. In addition, two grooves, 34 and 36, are illustrated. The two grooves, 34 and 36, are semicircular in cross section and their internal surfaces are coated with a conductive material. The functions of layers 30 and 32 and grooves 34 and 36 are not directly related to the method of the present invention and will not be described in detail herein. In addition, the electrical connections to the semiconductive component 26 are not directly related to the present invention and will not be described in detail herein.

Figure 3:
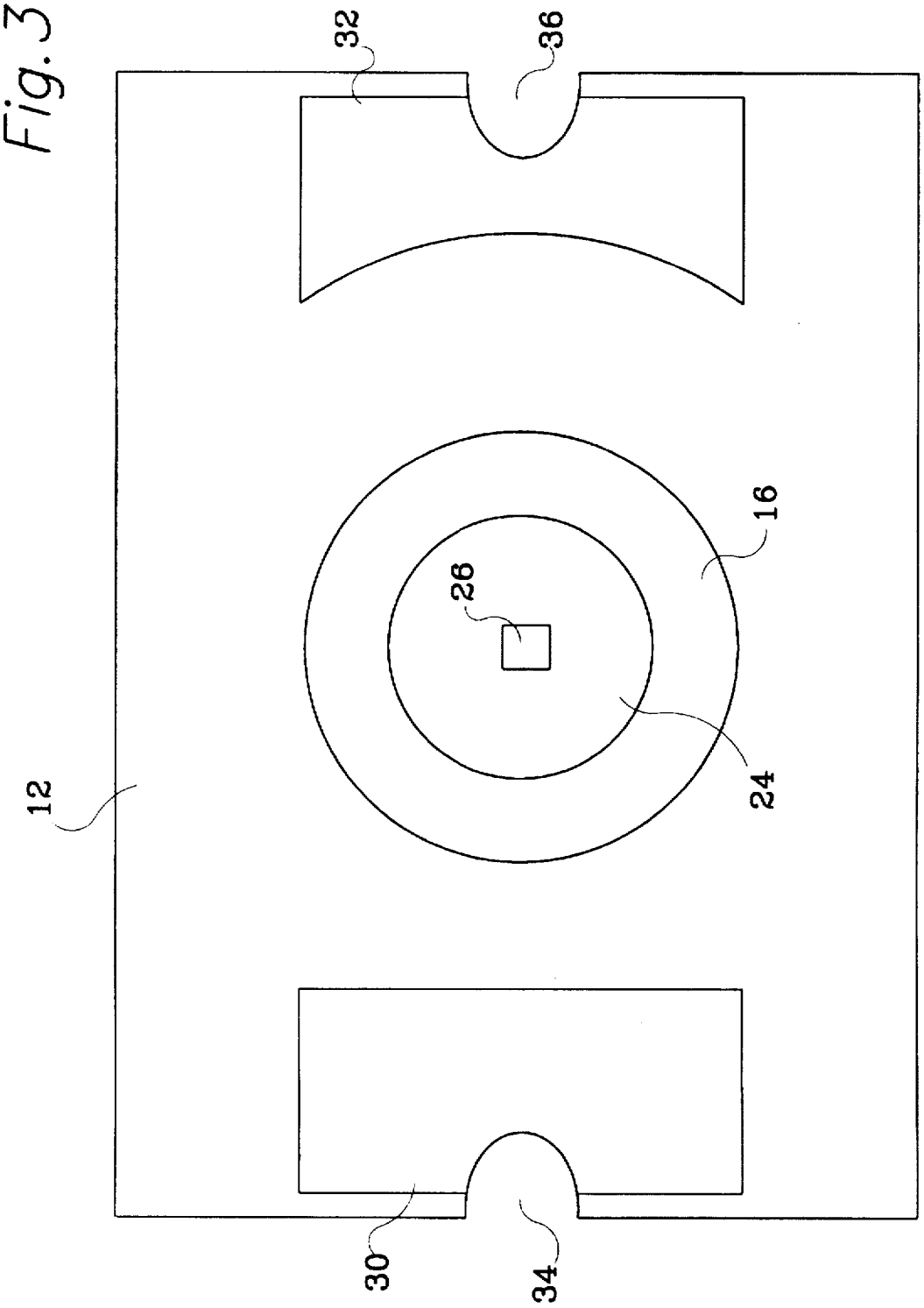
FIG. 3 is a top view of a ceramic body with an opening formed therein and a metallization layer formed on its surface.
Figure 4:
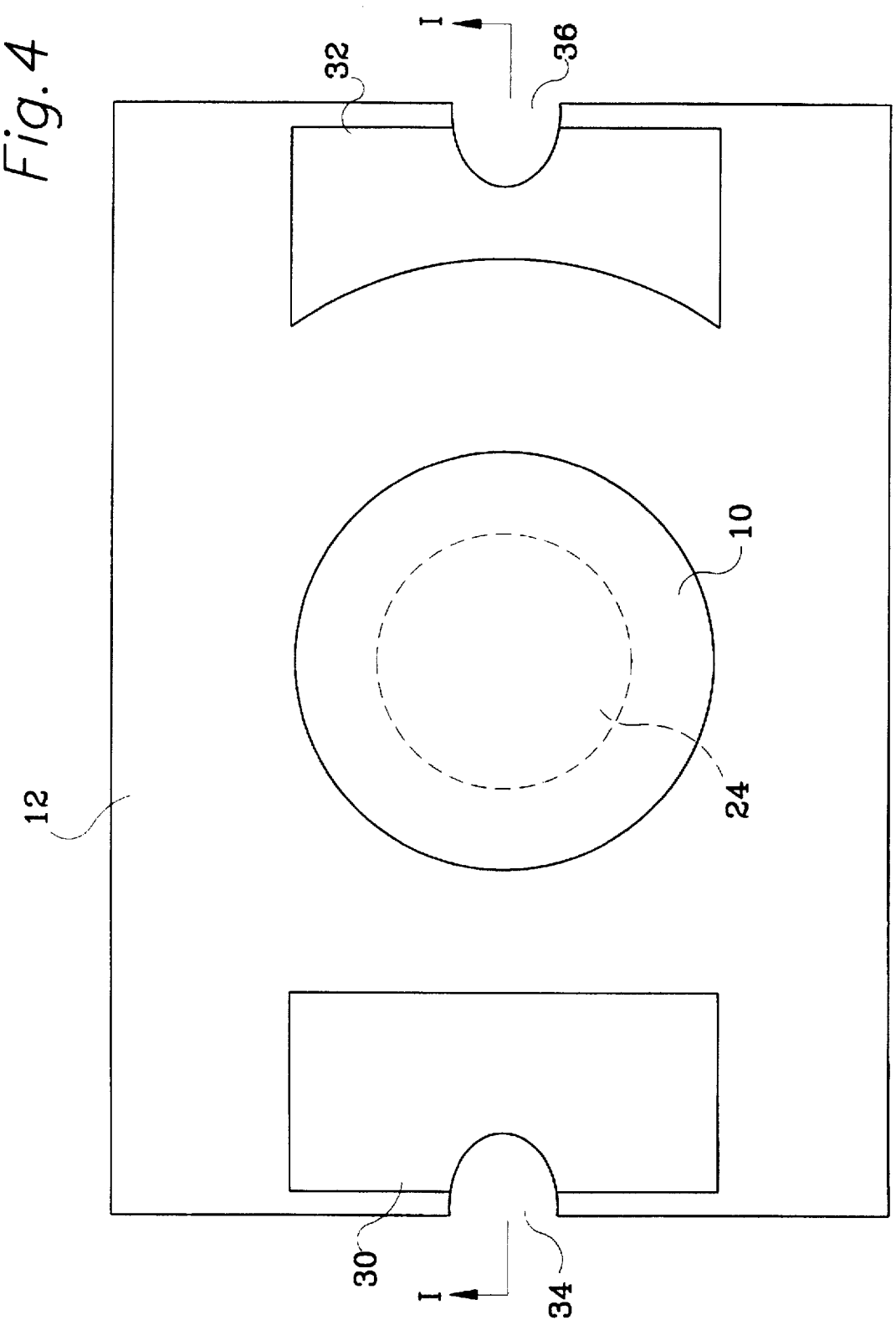
FIG. 4 is a top view of the component of FIG. 3 showing a lens disposed over the opening in the ceramic.
Figure 5:
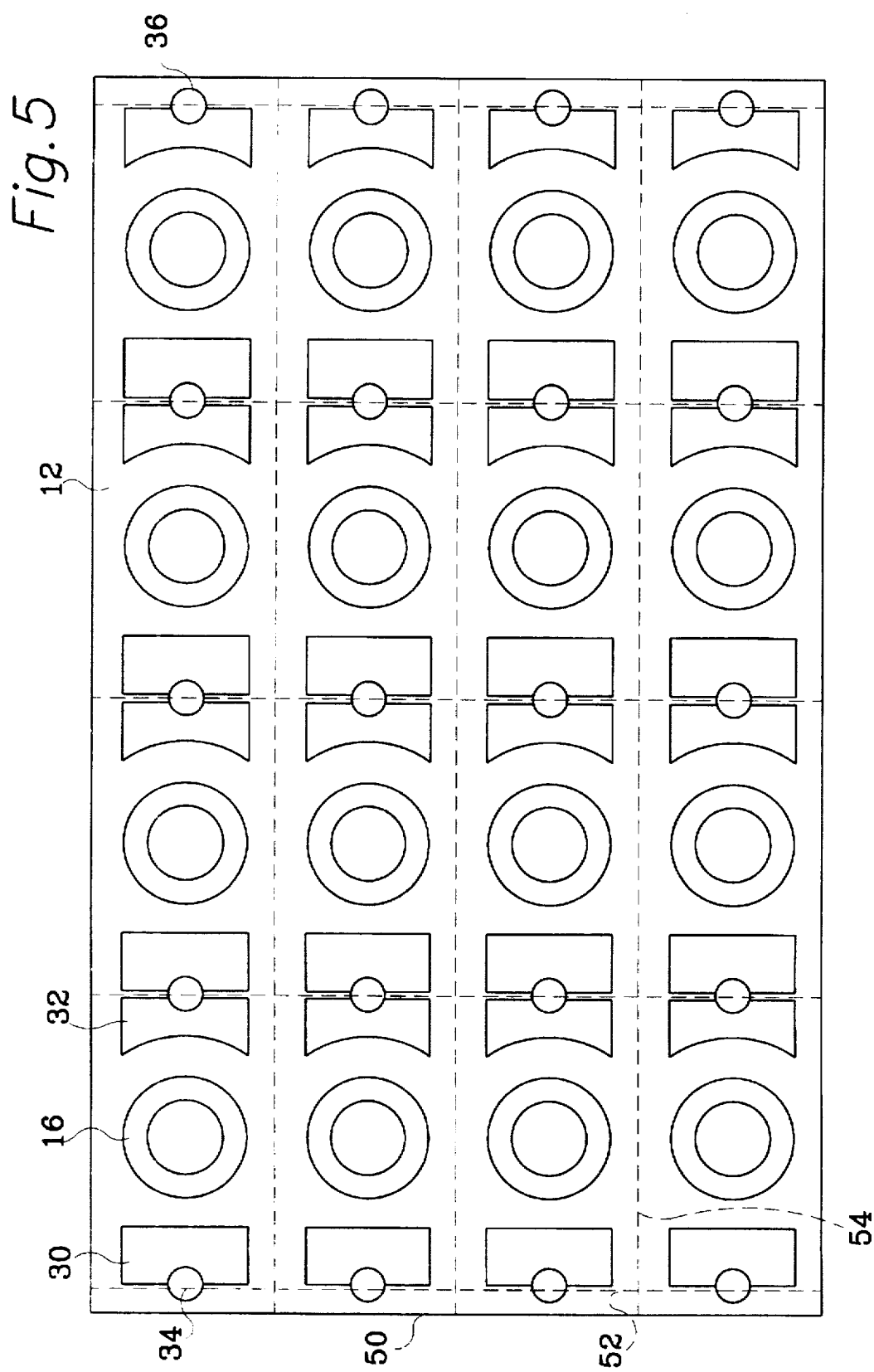
FIG. 5 is a structure comprising a plurality of the components shown in FIG. 3.

FIG. 3 is a top view of the ceramic body 12, its opening 24, the semiconductive component 26 disposed at the bottom of the opening 24, the second metallic surface 16, the two metallization layers, 30 and 32, on the upper surface of the ceramic body 12 and the two semicircular grooves, 34 and 36. FIG. 4 is a top view of the device shown in FIG. 1 with the lens 10 disposed over the opening 24, which is represented by dashed lines to show its location under the lens. The illustration in FIG. 1 is a section view of the illustration in FIG. 4. In order to understand the complexities of assembling the lens 10 to the ceramic body 12, it is necessary to appreciate the extremely small dimensions of the components. With reference to FIGS. 1 and 4, the total length of the ceramic body 12, measured from left to right in FIG. 4, is approximately 0.15 inches. Its total width, measured from top to bottom in FIG. 4, is approximately 0.10 inches. The outside diameter of the gold metallization layer 16 is approximately 0.070 inches and its inside diameter is approximately 0.040 inches. The outside diameter of the preformed solder component 20 is approximately 0.070 inches and its inside diameter is approximately 0.040 inches. The diameter of the first metallic surface 14, which is attached to the lens 10, is approximately 0.070 inches. The thickness of the preformed solder component 14 is approximately 0.0015 inches. In view of these very small dimensions, it can be seen that it would be significantly beneficial if a method could be devised to simplify the positioning of the tiny components with respect to each other in order to permit the process to complete the soldering operation with accuracy and simplicity. In order to form the individual ceramic bodies 12 discussed above, a larger ceramic structure 50 is formed and the various metallization layers are disposed on its upper surface as shown in FIG. 5. Scribe lines, represented by dashed lines in FIG. 5, permit the total structure shown in FIG. 5 to be separated into single components such as that described above in conjunction with FIG. 4. The vertical scribe lines 52 and horizontal scribe lines 54 permit the larger structure shown in FIG. 5 to be separated, or singulated, into the individual components that each comprise a ceramic body 12 as described above. The grooves, which begin as through holes, or vias, are identified by reference numerals 34 and 36 in FIG. 5. As shown, the vertical scribes lines 52 pass through these holes and, when the individual components are separated, they form grooves, 34 and 36, having semicircular cross sections.

Figure 6:
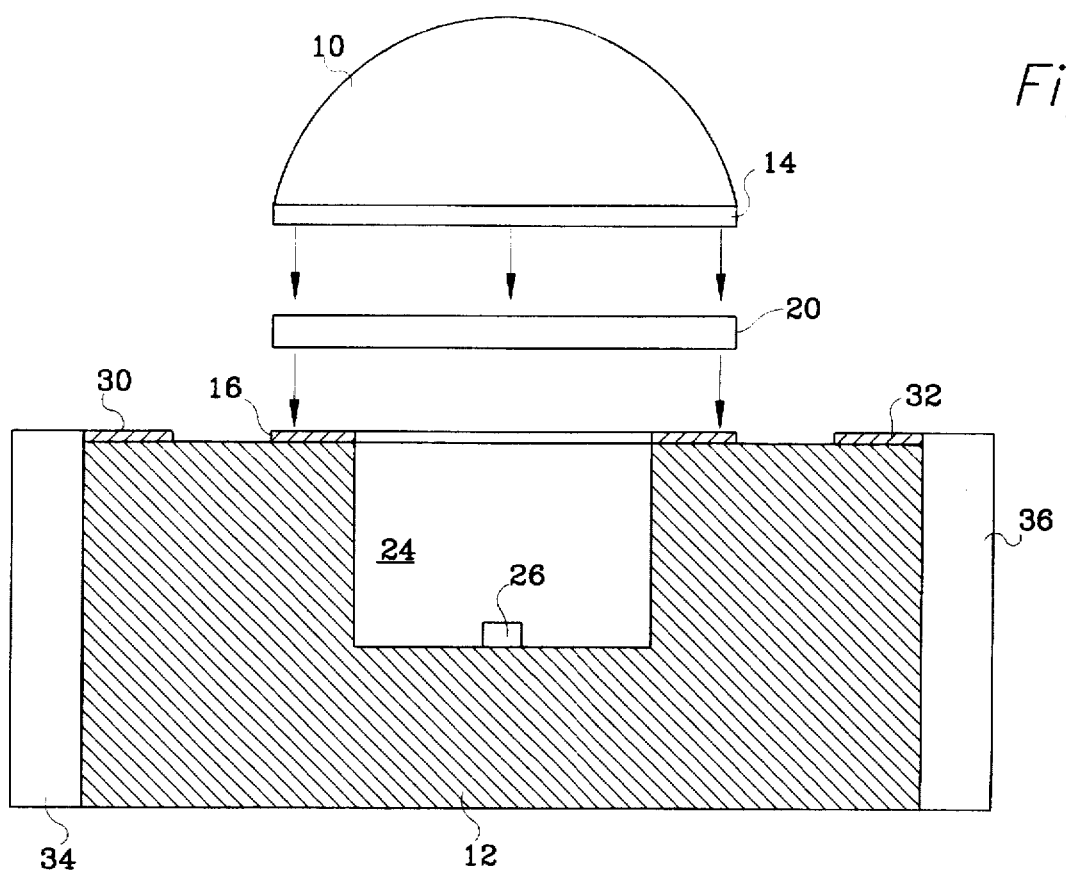
FIG. 6 is an exploded view of the device shown in FIG. 4.

With reference to FIG. 6, one hypothetical prior art method for manufacturing the device described above could be to place the preformed solder component 20 on the second metallic surface 16 and then place the lens 10 with its first metallic surface 14 on top of the preformed solder component 20. One skilled in the art will realize and appreciate the extreme difficulty in forming this unattached assembly and then maintaining the accurate positions of the separate components with respect to each other prior to completing the soldering operation. It is therefore necessary to provide a more feasible manufacturing technique for attaching the lens to the ceramic body 12. An alternative hypothetical prior art method for manufacturing the assembly shown in FIG. 6 would be to dispose the preformed solder component 20 on the second metallic surface 16 and then to melt it in place. Then, as a following step, the lens 10 could be placed with its first metallic surface 14 on top of the previously melted and then resolidified preform solder component 20. Ideally, the preformed solder component 20 could be remelted to attach the first metallic surface 14 to the second metallic surface 16. However, when the preformed solder component 20 is initially melted, the gold plating, cobolt, nickel and iron of the associated metallic surface can diffuse into the solder and create a compound that does not possess the ideal eutectic properties of the original preformed solder component 20. The presence of these elements as diffused elements in the melted and resolidified preformed solder component 20 results in an alloy that is not adequately wettable when later remelted and placed in contact with the gold plated metallic surface to which it is intended to be attached. This lack of wettability severely jeopardizes the ability to form a hermetic seal when the preformed solder component 20 is remelted and resolidified a second time. Because of these difficulties, it would be significantly beneficial if a technique could be devised to avoid the diffusion of gold cobolt, nickel and iron from the Kovar into the preformed solder component 20 prior to the final melting and resolidification of the preformed solder component 20 to attach the lens 10 to the ceramic body 12 with a hermetic seal.

Figure 7:
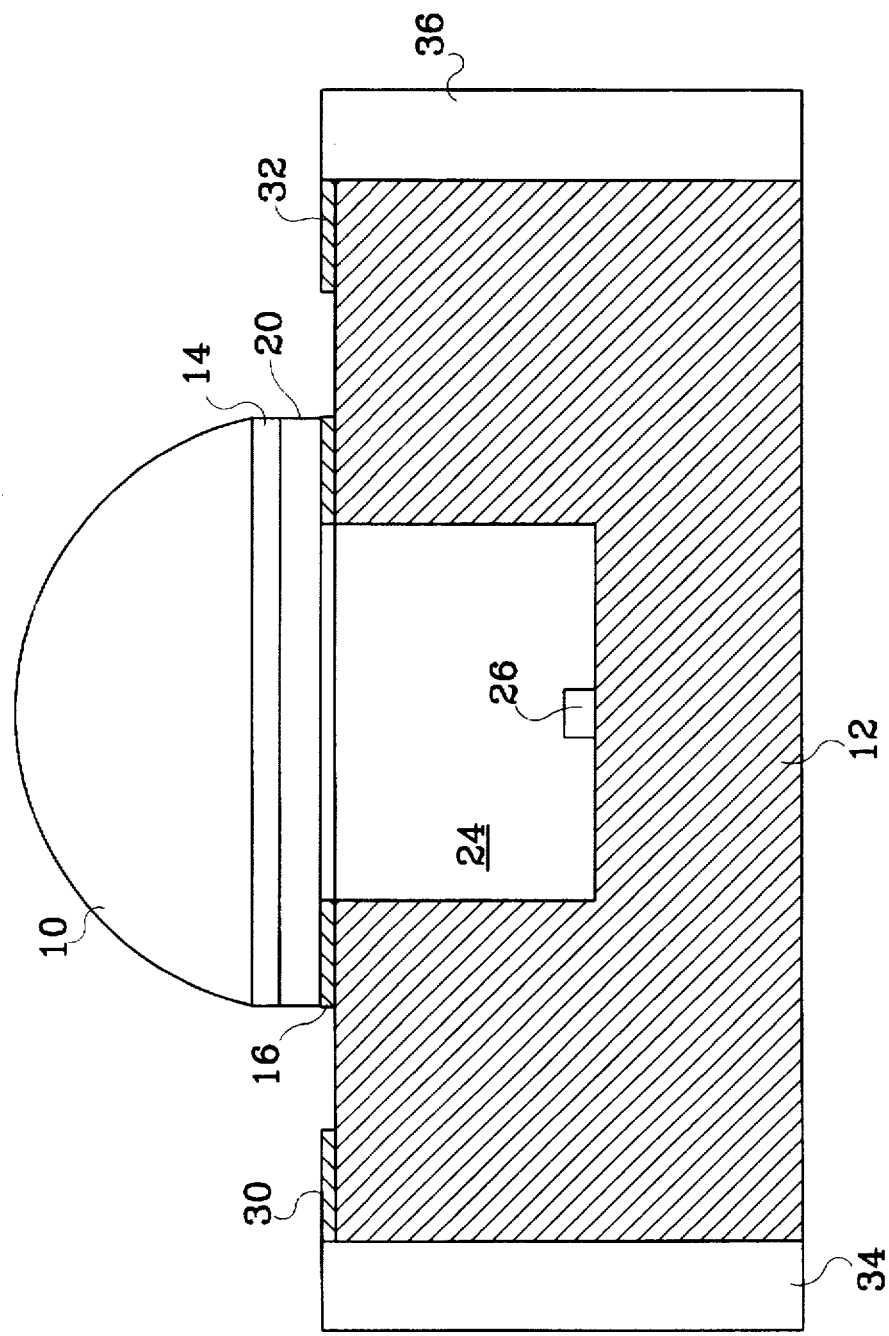
FIG. 7 is a sectional view of a completed device made by the method of the present invention.

FIG. 7 illustrates the desired configuration of the lens, the first metallic surface 14, the second metallic surface 16 and the preformed solder component 20 after the assembly of the components is complete to form the hermetic seal over the opening 24 and the semiconductive component 26.

Figure 8:
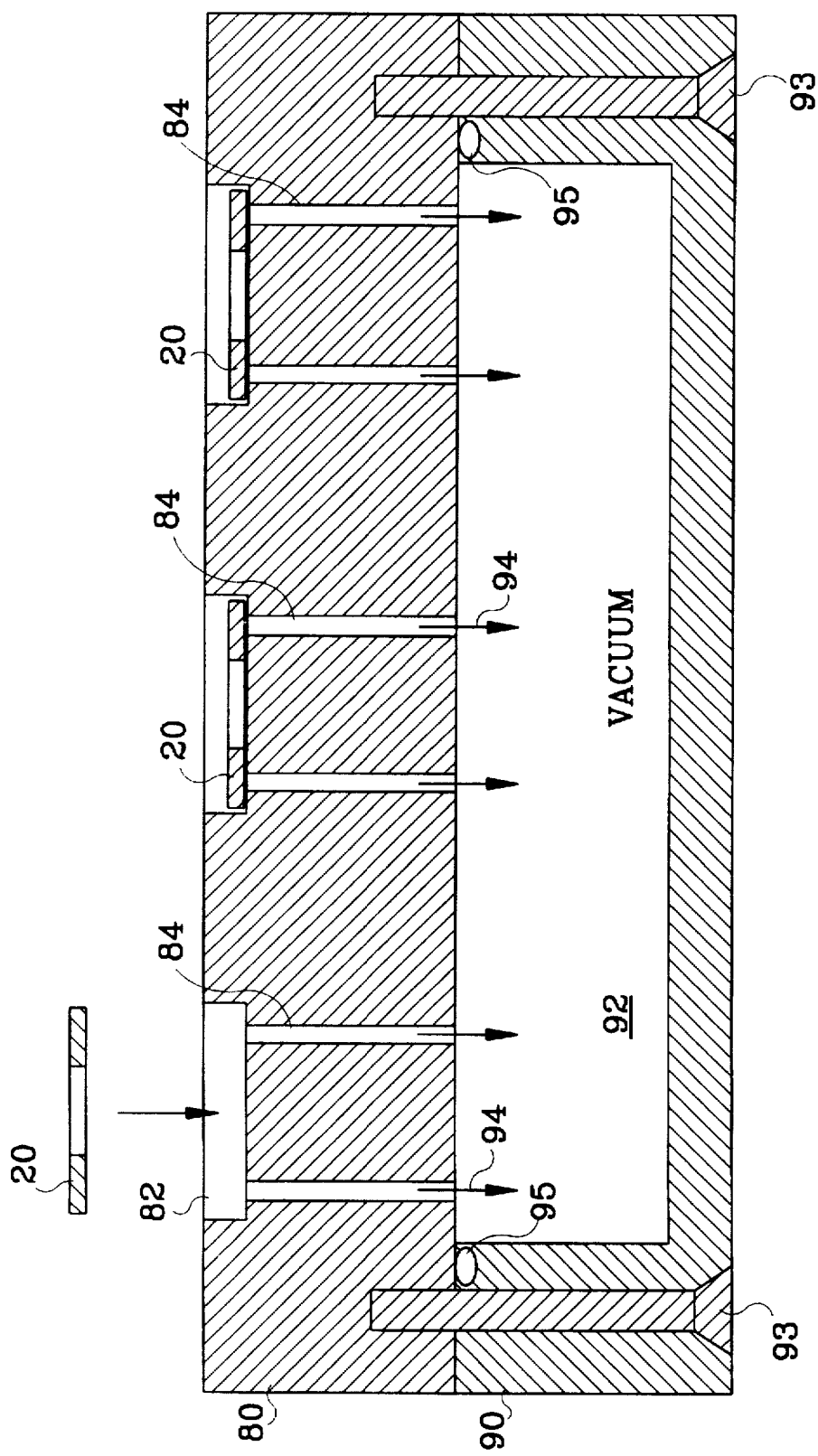
FIG. 8 is a fixture used in a preferred embodiment of the present invention.

FIG. 8 shows a tool used to perform some of the functions of the present invention. A first fixture 80 is provided with a plurality of circular openings 82 formed in its surface. Each of the generally circular openings 82 is shaped to receive a single preformed solder component 20 therein. To facilitate the placement of the preformed solder components 20 within the openings 82, the openings are provided with an inside diameter of approximately 0.071 inches which permits a slight clearance between approximately 0.001 inches it and the outside diameter of the preformed solder component 20 which is approximately 0.070 inches. It should be understood that, for purposes of illustration, the scale of FIG. 8 is modified and exaggerated to permit the various components to be shown more clearly. The depth of each of the openings 82 is approximately 0.0015 inches. Extending from each of the openings 82 are holes 84 which provide fluid communication between the openings 82 and the bottom surface of the first fixture 80. When a second fixture 90 is placed against the bottom surface of the first fixture 80, a chamber 92 is formed. If a vacuum is drawn within the chamber 92, air will flow in the direction of the arrows 94 and a vacuum will be formed at the underside of each of the preformed solder components 20. This vacuum will retain the preformed solder components in their respective positions within the openings 82.

In FIG. 8, the first fixture 80 is attached to the second fixture 90 with screws 93 which perform two functions. First, they align the first and second fixtures relative to each other and, secondly, they maintain the attachment between the first and second fixtures during the procedures that will be described in greater detail below. In addition, a seal 95 is used to maintain the vacuum within chamber 92 and prevent leakage through the interface between the first and second fixtures, 80 and 90. Although the illustration I FIG. 8 is highly schematic and simplified for clarity, it should be understood that the seal 95 can typically be an O-ring disposed within an annular groove formed in the mating surfaces of either the first or the second fixtures.

Figure 9:
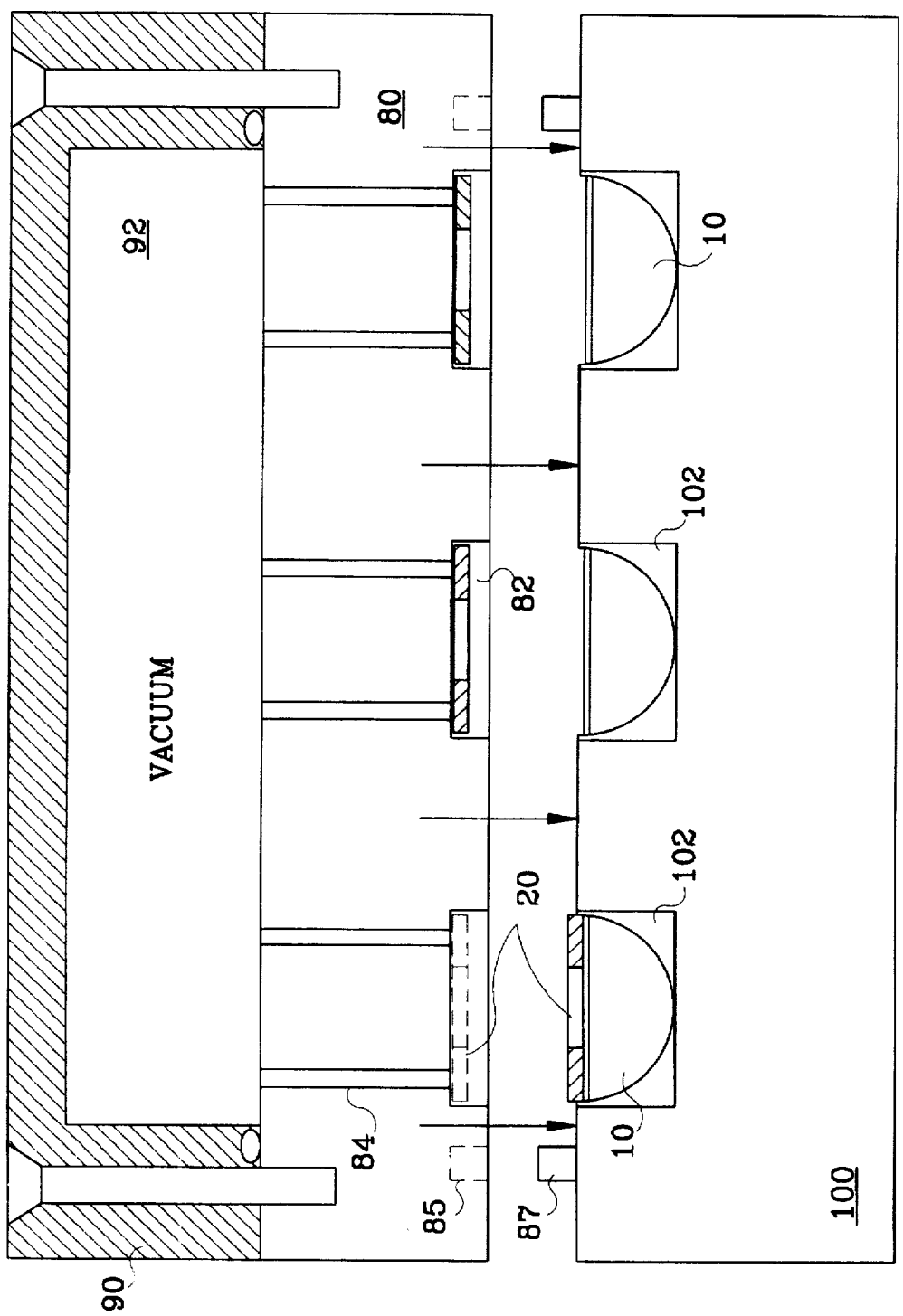
FIG. 9 illustrates a step of the present invention which places preformed solder components on top of the first metallic surfaces attached to lenses.

FIG. 9 illustrates the first and second fixtures after they have been inverted and placed over a third fixture 100. The vacuum in chamber 92 maintains the position of the preformed solder components 20. For the purpose of illustrating the relative positions of the openings 82 and the associated openings 102 in the third fixture 100, one of the preformed solder components 20 is shown in dashed lines in its opening 82 and in solid lines in its opening 102. This illustrates that it is necessary to provide appropriate alignment between the first and second fixtures, 80 and 90, and the third fixture 100. To perform this alignment function, the third fixture 100 can be provided with two or more pins 87 that are shaped to be received in associated holes 85 formed in the first fixture 80. Naturally, those skilled in the art will realize that many other alternative techniques are available to properly align the fixtures together. As represented by the arrows in FIG. 9, the first and second fixtures are lowered until the pins 87 are inserted into the holes 85 and the preformed solder components 20 are disposed in contact with the gold surfaces which are attached to the lenses 10. When this alignment is complete, the vacuum in chamber 92 can be removed to allow all of the preformed solder components to drop down onto their associated lenses. The first and second fixtures, 80 and 90, can then be removed from the third fixture 100.

The lenses 10 are disposed in the openings 102 as shown. The openings 102 are approximately 0.040 inches deep and arranged in the upper surface of the first fixture 100 to coincide with the positions of openings 82 in the first fixture 80. In FIG. 9, the first fixture 80 is positioned over the third fixture 100 with the vacuum in chamber 92 retaining the preformed solder components 20 in their appropriate positions within openings 82. As indicated by the arrows in FIG. 9, the first fixture 80 is lowered into contact with the third fixture 100 to place the preformed solder components 20 directly above the lenses 10 and their first metallic surfaces. Then the vacuum can be released to drop the preformed solder components 20 down onto the first metallic surfaces of the lenses 10. Because of the extremely small size of the components, those skilled in the art will realize the beneficial effect of using a vacuum to retain the small preformed solder components 20 within their openings 82 during the procedure described above. After the removal of the first and second fixtures, 80 and 90, from the third fixture 100, the third fixture can be placed on a graphite heating plate to perform the next step of the present invention.

Figure 10:
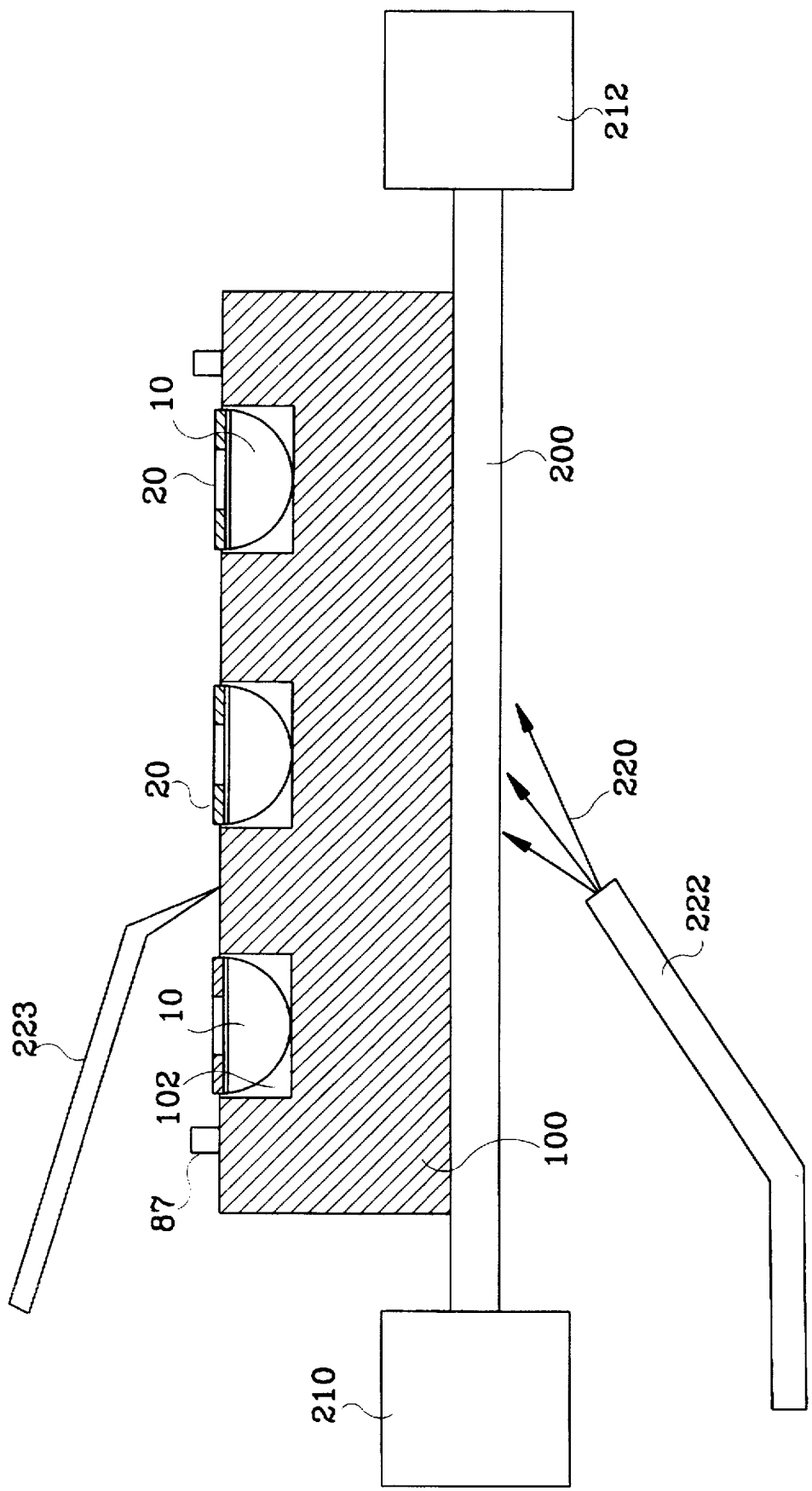
FIG. 10 shows a heating step of the present invention.

In FIG. 10, the third fixture 100 is shown holding the lenses 10 and associated preformed solder components 20 after the first and second fixtures, 80 and 90, have been removed. The third fixture 100 is then placed on a graphite heater 200 which is connected between two supports, 210 and 212. When an electric current is passed through the graphite heater 200, the third fixture 100, the lenses 10, their respective first metallic surfaces and the preformed solder components 20 are all heated. A thermocouple 223 is placed in thermal communication with the components, as shown, and the temperature of the structure shown in FIG. 10 is constantly monitored as electric current is passed through the graphite heater 200. When the temperature of the third fixture 100 reaches a preselected magnitude, the electrical current passing through the graphite heater 200 is immediately turned off and a jet 220 of cold gas is caused to flow through a tube 222 and pass into thermal communication with the graphite heater 200 to rapidly cool it to a magnitude which is significantly less than the preselected temperature described above. Although the temperature control component is not shown in FIG. 10, it should be understood that any one of several commercially available devices can be used to monitor the temperature sensed by the thermal couple 223 and turn off the electrical power to the graphite heater 200 when a preselected temperature is achieved. For example, a temperature control device that is satisfactory for use to accomplish these purposes is commercially available from Omega Engineering, Inc. and identified as Model No. CN8542. The output signal from this type of device can be used to terminate the electrical current flowing through the graphite heater 200 and also to initiate the flow of cold gas 220 through tube 222. For purposes of clarity, these commercially available components are not shown in FIG. 10, but it should be understood that they would comprise the temperature controller, a switch capable of making and breaking the electric circuit to the graphite heater 200 and a valve sufficient to open and close the tube 222 to control the flow of gas 220.

The preselected temperature described above is specifically chosen to allow the preformed solder components 20 to begin to partially melt at their surfaces, but is not sufficiently high to cause the preformed solder components 20 to melt completely. This creates a tackiness at the surface of the preformed solder component 20 and permits it to adhere to the first metallic surface that is rigidly attached to the lens 10. When the graphite heater 20 is suddenly cooled in response to the flow of cold gas 220, the first metallic surfaces of the lenses 10 adhere to the associated preformed solder component 20. It should be understood that, during the process described above in conjunction with FIG. 10, the preformed solder components 20 are never completely melted. They merely become sufficiently tacky at their surfaces to stick to the first metallic surfaces 14 which are rigidly attached to the lenses 10. When the solder is then cooled as a result of the flow of the cold gas 220, the lenses 10 and the preformed solder components 20 adhere to each other to form a first assembly. The first assembly can then be lifted away from the fixtures shown in FIG. 10 and handled without the preformed solder components 20 becoming detached from the first metallic surfaces of the lenses 10.

Figure 11:
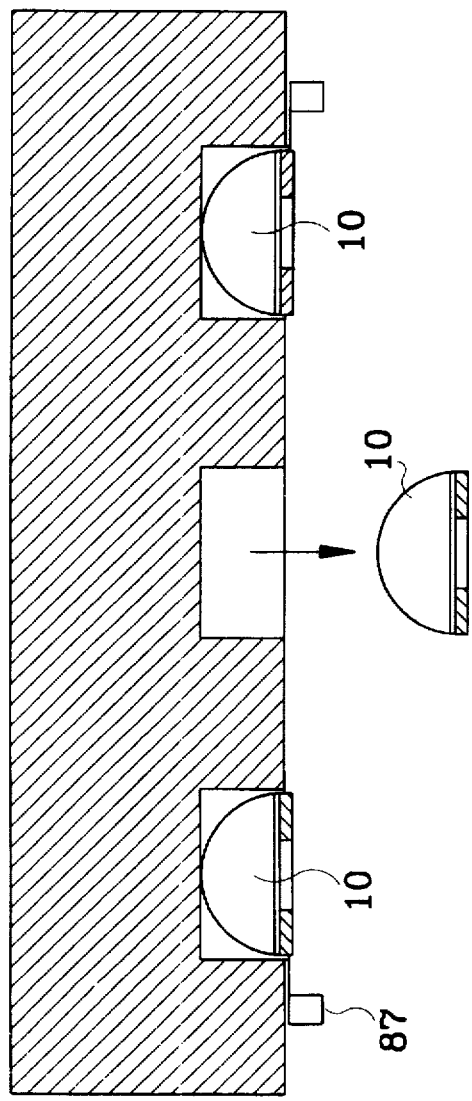
FIG. 11 shows the removal of lenses from a fixture.
Figure 12:
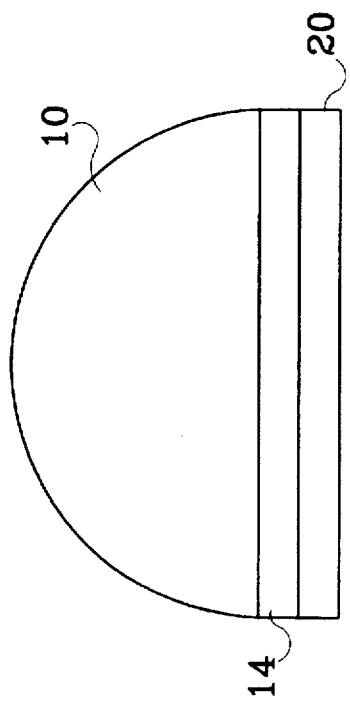
FIG. 12 shows a completed first assembly that comprises a lens with its first metallic surface attached to a preformed solder component.

This result is shown in FIG. 11. The third fixture 100 can be inverted as shown to cause the lenses 10 to be removed from their respective openings. When the lenses 10 are removed from the third fixture, the preformed solder components 20 will remain attached to the first metallic surfaces of the lenses 10. This creates a subassembly such as that shown in FIG. 12. The preformed solder component 20 is attached to the first metallic surface 14 of the lens 10 and can be handled as a first assembly. The first assembly can then be placed in position on the second metallic surface 16 as shown in FIG. 2. When the first assembly is placed on the second metallic surface 16, the temperature of the entire structure can be raised to a magnitude which is sufficient to melt the preformed solder component 20 completely and fuse the first metallic surface 14 to the second metallic surface 16. The process described above in conjunction with the present invention significantly simplifies the manufacturing procedure and allows the small components to be handled more readily than would be possible without the techniques and procedures of the present invention.

Although the present invention has been described with particular detail and illustrated with specificity to show one particularly preferred embodiment of the present invention, it should be understood that other embodiments are also within its scope. For example, the present invention has been described in conjunction with a first metallic surface that is a gold plated Kovar ring. Other metals could be used in other embodiments. In addition, the preformed solder component 20 has been described as a gold and tin solder alloy. Other alloys could be used in alternative embodiments of the present invention. Furthermore, the second metallic surface 16 has been described as a gold metallization layer on the ceramic body 12. Other metallizations could be used in alternative embodiments of the present invention. In a preferred embodiment of the present invention, nitrogen gas 220 is used to cool the graphite heater 200.

The preselected temperature used to cause the preformed solder component to become sufficiently tacky to adhere to the first metallic surface can vary in different applications of the present invention. This temperature depends on the type of solder used, the overall structure of the fixtures used to hold the components and the position of the thermocouple 223 used to measure the relevant temperatures. In one specific application of the present invention, the preselected temperature is 285° Centigrade. This was determined empirically by repeated experimental attempts to create the desired level of tackiness and adherence between the preformed solder component and the first metallic surface. Through repeated experiments, the desired preselected temperature is selected so that the preformed solder component does not melt completely to allow the gold and the constituent elements of the Kovar from the first metallic surface to diffuse into it. This preselected temperature, which is appropriate for a given application and fixturing, can be determined relatively easily through a series of experimental tests using various temperatures until an appropriate temperature is selected. The temperature should be sufficient to create the tackiness described above, but insufficient to completely melt the preformed solder component. It is important to rapidly cool the fixture after the preselected temperature is achieved to prevent the flow of more heat into the miniature components after the graphite heater is turned off. To facilitate this rapid cooling, the graphite heater has a very low thermal mass, or thermal inertia. Therefore, the heat capacitance of the graphite heater is low and allows the entire structure to be cooled rapidly by the gas stream when the desired temperature is reached. The graphite heater plate 200, in a preferred embodiment of the present invention, is approximately 0.060 inches thick.

The embodiments of the invention in which an exclusive property or right is claimed are defined as follows:

1. A method for attaching components to each other, comprising:

providing a first component having a first metallic surface;

providing a second component having a second metallic surface;

providing a preformed solder component;

disposing said preformed solder component in contact with said first metallic surface of said first component;

heating said first metallic surface and said preformed solder component to a preselected temperature, said preselected temperature being greater than that required to cause said preformed solder component to adhere to said first metallic surface to form a first assembly and less than that required to completely melt said preformed solder component;

rapidly cooling said first assembly when said first metallic surface and said preformed solder component reach said preselected temperature;

disposing said first assembly on said second component with said preformed solder component in contact with said second metallic surface; and raising the temperature of said preformed solder component to completely melt said preformed solder component, whereby said first and second metallic surfaces are rigidly attached to each other.

2. The method of claim 1, wherein:

said first component is a lens.

3. The method of claim 2, wherein:

said first metallic surface comprises a gold plated Co—Ni—Fe ring attached to said lens.

4. The method of claim 1, wherein:

said second component comprises a ceramic body.

5. The method of claim 4, wherein:

said second metallic surface is a gold metallization layer disposed on a surface of said ceramic body.

6. The method of claim 1, wherein:

said preformed solder component comprises a gold and tin alloy.

7. The method of claim 1, wherein:

said heating step comprises the steps of disposing said first and second components on a graphite heater and passing an electric current through said graphite heater.

8. The method of claim 7, wherein:

said cooling step comprises a step of causing a gas to flow in thermal communication with said graphite heater.

9. The method of claim 8, wherein:

said gas is nitrogen.

10. The method of claim 1 further comprising:

disposing a semiconductor within an opening within said second component under said first component.

11. A method for attaching components to each other, comprising:

providing a first component having a first metallic surface, said first component being a lens;

providing a second component having a second metallic surface;

providing a preformed solder component;

disposing said preformed solder component in contact with said first metallic surface of said first component;

heating said first metallic surface and said preformed solder component to a preselected temperature, said preselected temperature being greater than that required to cause said preformed solder component to adhere to said first metallic surface to form a first assembly and less than that required to completely melt said preformed solder component;

rapidly cooling said first assembly when said first metallic surface and said preformed solder component reach said preselected temperature;

disposing said first assembly on said second component with said preformed solder component in contact with said second metallic surface; and raising the temperature of said preformed solder component to completely melt said preformed solder component, whereby said first and second metallic surfaces are rigidly attached to each other.

12. The method of claim 11, wherein:

said first metallic surface comprises a gold plated Co—Ni—Fe ring attached to said lens.

13. The method of claim 11, wherein:

said second component comprises a ceramic body.

14. The method of claim 13, wherein:

said second metallic surface is a gold metallization layer disposed on a surface of said ceramic body.

15. The method of claim 11, wherein:

said preformed solder component comprises a gold and tin alloy.

16. The method of claim 11, wherein:

said heating step comprises the steps of disposing said first and second components on a graphite heater and passing an electric current through said graphite heater.

17. The method of claim 16, wherein:

said cooling step comprises a step of causing a gas to flow in thermal communication with said graphite heater.

18. The method of claim 17, wherein:

said gas is nitrogen.

19. The method of claim 11, further comprising:

disposing a semiconductor within an opening within said second component under said first component.

20. A method for attaching components to each other, comprising:

providing a first component having a first metallic surface, said first component being a lens;

providing a second component having a second metallic surface;

providing a preformed solder component;

disposing said preformed solder component in contact with said first metallic surface of said first component;

heating said first metallic surface and said preformed solder component to a preselected temperature, said preselected temperature being greater than that required to cause said preformed solder component to adhere to said first metallic surface to form a first assembly and less than that required to completely melt said preformed solder component;

rapidly cooling said first assembly when said first metallic surface and said preformed solder component reach said preselected temperature;

disposing said first assembly on said second component with said preformed solder component in contact with said second metallic surface;

raising the temperature of said preformed solder component to completely melt said preformed solder component, whereby said first and second metallic surfaces are rigidly attached to each other, said first metallic surface comprising a gold plated Co—Ni—Fe ring attached to said lens, said second component comprising a ceramic body, said second metallic surface being a gold metallization layer disposed on a surface of said ceramic body, said preformed solder component comprising a gold and tin alloy, said heating step comprising the steps of disposing said first and second components on a graphite heater and passing an electric current through said graphite heater, said cooling step comprising a step of causing a gas to flow in thermal communication with said graphite heater, said gas being nitrogen; and disposing a semiconductor within an opening within said second component under said first component.

* * * * *

UNITED STATES PATENT AND TRADEMARK OFFICE
CERTIFICATE OF CORRECTION

PATENT NO. : 5,758,816  
DATED : June 2, 1998  
INVENTOR(S) : Simon M. Rabinovich It is certified that error appears in the above-identified patent and that said Letters Patent is hereby corrected as shown below:

Title Page, the invention illustration should be as shown on the attached Title page.

Signed and Sealed this

Thirtieth Day of May, 2000

Attest:

Q. TODD DICKINSON

*Attesting Officer*     *Director of Patents and Trademarks*

United States Patent [19]
Rabinovich

[11] Patent Number: 5,758,816
[45] Date of Patent: Jun. 2, 1998

[54] METHOD FOR ATTACHING SMALL COMPONENTS TO EACH OTHER

[75] Inventor: Simon M. Rabinovich, Plano, Tex.

[73] Assignee: Honeywell Inc., Minneapolis, Minn.

[21] Appl. No.: 700,069

[22] Filed: Aug. 19, 1996

[51] Int. Cl.$^6$ .................... B23K 1/00; B23K 31/02; B23K 103/18

[52] U.S. Cl. .................... 228/121; 228/227; 228/233.2

[58] Field of Search .................... 228/121, 233.2, 228/227

[56] References Cited

U.S. PATENT DOCUMENTS

| | | | |
|---|---|---|---|
| 3,340,602 | 9/1967 | Hontz | 228/233.2 |
| 4,356,047 | 10/1982 | Gordon et al. | 228/121 |
| 4,746,583 | 5/1988 | Falanga | 228/121 |
| 4,833,102 | 5/1989 | Byrne et al. | 228/121 |
| 4,972,988 | 11/1990 | Ohdate | 228/233.2 |

Primary Examiner—P. Austin Bradley
Assistant Examiner—Jeffrey T. Knapp
Attorney, Agent, or Firm—William D. Lanyi; Roland W. Norris

[57] ABSTRACT

A method is provided to heat a plurality of components to a preselected temperature that creates a tackiness at the surface of a preformed solder component and permits the preformed solder component to adhere to a first metallic surface of a first component. When the preselected temperature is reached, the components are rapidly cooled to prevent diffusion that would result from further heating and melting of the preformed solder component. In a particularly preferred embodiment of the invention, the first component is a lens that has a first metallic surface rigidly attached thereto. A second metallic surface is attached to a ceramic body and a preformed solder component is disposed between the first and second metallic surfaces. After a first assembly is formed from the first metallic surface and the preformed solder component that adheres to it, the first assembly is disposed on the second surface and the preformed solder component is completely melted to rigidly attach the first and second metallic surfaces to each other to provide a hermetic seal.

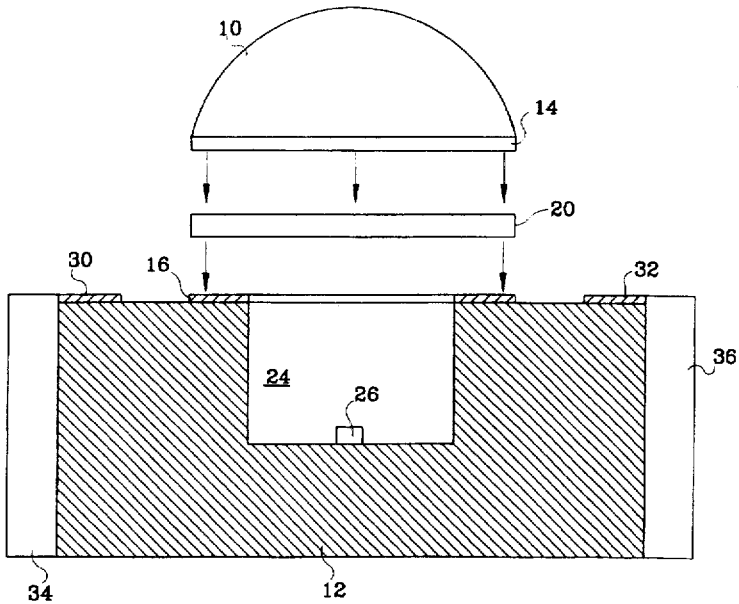

20 Claims, 11 Drawing Sheets